(12) United States Patent
Häfner et al.

(10) Patent No.: US 9,065,326 B2
(45) Date of Patent: Jun. 23, 2015

(54) SWITCHING MODULE FOR USE IN A DEVICE TO LIMIT AND/OR BREAK THE CURRENT OF A POWER TRANSMISSION OR DISTRIBUTION LINE

(75) Inventors: Jürgen Häfner, Ludvika (SE); Peter Lundberg, Västerås (SE); Roland Siljeström, Grängesberg (SE); Ulrich Schlapbach, Liebefeld (CH); Bo Biljenga, Åmål (SE); Erika Siljeström, legal representative, Skultuna (SE)

(73) Assignee: ABB TECHNOLOGY LTD, Zurich (CH)

(*) Notice: Subject to any disclaimer, the term of this patent is extended or adjusted under 35 U.S.C. 154(b) by 144 days.

(21) Appl. No.: 13/576,667

(22) PCT Filed: Feb. 3, 2010

(86) PCT No.: PCT/EP2010/051313
§ 371 (c)(1),
(2), (4) Date: Sep. 27, 2012

(87) PCT Pub. No.: WO2011/095212
PCT Pub. Date: Aug. 11, 2011

(65) Prior Publication Data
US 2013/0009491 A1    Jan. 10, 2013

(51) Int. Cl.
*H01H 9/30* (2006.01)
*H02M 1/092* (2006.01)
(Continued)

(52) U.S. Cl.
CPC ......... *H02M 1/092* (2013.01); *H03K 17/08148* (2013.01); *H03K 17/107* (2013.01);
(Continued)

(58) Field of Classification Search
CPC .................. H02M 1/092; H02J 3/36
USPC ........................................................... 361/13
See application file for complete search history.

(56) References Cited

U.S. PATENT DOCUMENTS 3,671,749 A    6/1972  Harnden, Jr.
3,928,776 A   12/1975  Thiele
(Continued)

FOREIGN PATENT DOCUMENTS

DE         10312704 A1    9/2004
DE      102004016456 A1   11/2005
(Continued)

OTHER PUBLICATIONS

C. Benboujema et al., "Low Losses Bidirectional Switch for AC Mains", 13th European Conference on Power Electronics and Applications, Sep. 2009, pp. 1-10. XP 31541432.
(Continued)

*Primary Examiner* — Rexford Barnie
*Assistant Examiner* — Tien Mai
(74) *Attorney, Agent, or Firm* — Birch, Stewart, Kolasch & Birch, LLP

(57) ABSTRACT

A switching module, intended to be used in a medium or high voltage DC breaker or a DC current limiter, includes at least one power semiconductor switching element, a gate unit arranged to turn the at least one power semiconductor switching element on and off, respectively, according to a switching control signal, and an energy storage capacitor arranged to provide power to a power supply input of the gate unit. The switching module further includes a power transformation device arranged to receive an optical power signal, to transform the optical power signal into an electrical power signal and to provide the electrical power signal to the energy storage capacitor.

20 Claims, 6 Drawing Sheets

Figure 1:
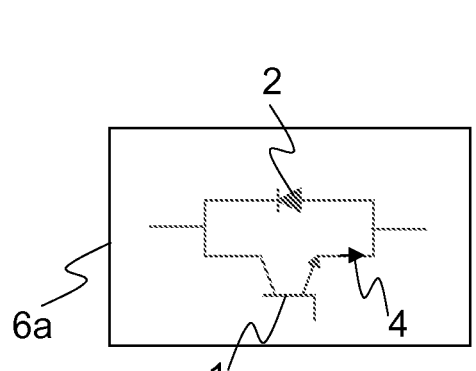

(51) Int. Cl.
*H03K 17/0814* (2006.01)
*H03K 17/10* (2006.01)
*H03K 17/12* (2006.01)
*H03K 17/689* (2006.01)
*H03K 17/785* (2006.01)

(52) U.S. Cl.
CPC ............ *H03K17/127* (2013.01); *H03K 17/689* (2013.01); *H03K 17/785* (2013.01); *H03K 2217/0081* (2013.01)

(56) References Cited

U.S. PATENT DOCUMENTS

| | | | |
|---|---|---|---|
| 3,999,034 A * | 12/1976 | Barhorst | 219/130.32 |
| 5,846,073 A * | 12/1998 | Weaver | 432/241 |
| 6,204,493 B1 | 3/2001 | Fischl et al. | |
| 6,597,853 B2 * | 7/2003 | Cabot et al. | 385/135 |
| 6,880,740 B2 * | 4/2005 | Lu | 227/131 |
| 6,975,122 B2 * | 12/2005 | Gonthier et al. | 324/522 |
| 7,855,904 B2 * | 12/2010 | Kirbie et al. | 363/60 |
| 8,027,132 B2 * | 9/2011 | Omaru | 361/93.1 |
| 2001/0033500 A1 | 10/2001 | Hummert et al. | |
| 2006/0262577 A1 | 11/2006 | Schenk | |
| 2009/0296777 A1 * | 12/2009 | Fish | 374/152 |

FOREIGN PATENT DOCUMENTS

| | | |
|---|---|---|
| DE | 102007031140 A1 | 1/2009 |
| EP | 0488201 A1 | 6/1992 |
| EP | 0867998 A1 | 9/1998 |
| EP | 0868014 A1 | 9/1998 |
| FR | 2254077 A1 | 7/1975 |
| JP | 2006254675 A | 9/2006 |
| WO | WO 2007/128675 A1 | 11/2007 |
| WO | WO 2009/065233 A1 | 5/2009 |

OTHER PUBLICATIONS

J. Adamck et al., "Fast Commutation Process and Demand of Bidirectional Switches in Matrix Converters", IEEE 34th Annual Power Electronics Specialist Conference, vol. 3, Jun. 2003, pp. 1281-1286. XP10647625.

* cited by examiner

1

SWITCHING MODULE FOR USE IN A DEVICE TO LIMIT AND/OR BREAK THE CURRENT OF A POWER TRANSMISSION OR DISTRIBUTION LINE

The invention relates to a switching module which is arranged to be used in a device to limit and/or break an electrical current flowing through a power transmission or distribution line, where the switching module comprises at least one power semiconductor switching element, a gate unit arranged to turn the at least one power semiconductor switch on and off, respectively, according to a switching control signal, and an energy storage capacitor arranged to provide power to a power supply input of the gate unit.

The invention stems originally from the field of high voltage direct current (HVDC) breakers and current limiters, i.e. of switching devices which are able to limit and/or break a direct current flowing through a power transmission line, where the line is at a voltage level above 50 kV. However, the invention is also applicable to breakers for medium voltage DC power distribution, i.e. for a DC voltage range between about 1 kV and 50 kV, and bidirectional embodiments of the invention are even applicable to breakers for AC power transmission and distribution at any voltage level.

In EP 0867998 B1, a solid-state DC breaker is described which comprises a parallel connection of at least one main power semiconductor switch and of a non-linear resistor working as a surge arrester. When the DC breaker is operated to interrupt a DC current in a DC transmission or distribution line, the at least one main power semiconductor switch commutates the DC current into the non-linear resistor which then reduces the DC current by dissipating the stored energy in the DC line. In PCT/EP2009/065233, another solid-state DC breaker is presented which in parallel to the parallel connection of main power semiconductor switch and surge arrester contains a series connection of a mechanical high speed switch and of at least one auxiliary power semiconductor switch.

In practice, such solid state DC breakers, in order to be applicable for the voltage level of DC power transmission or distribution systems, need to contain a considerable number of series connected main power semiconductor switches since a single power semiconductor switch has a comparatively low rated voltage. The number of series connected main power semiconductor switches can easily reach several hundreds in case of an HVDC voltage level of several hundred kV.

With respect to the present invention, both the main power semiconductor switches as well as possibly present auxiliary power semiconductor switches of a DC breaker or DC current limiter each represent a switching module, i.e. they comprise, besides one or several power semiconductor switching elements, a gate unit and an energy storage capacitor. Such switching modules are for example described in detail in EP 0 868 014 B1, where the energy storage capacitor is connected via a DC/DC converter to the power supply input of the gate unit. The energy stored in the capacitor is transformed via the DC/DC converter into the DC supply voltage required by the gate unit for its usual operation of turning the at least one power semiconductor switching element on and off. The energy storage capacitor itself is connected to the so called high voltage primary circuit, i.e. it is connected to the same circuit and thereby to the same high voltage level as the at least one power semiconductor switching element of that particular switching module. Whenever the at least one power semiconductor switching element is in the blocking—i.e. non-conducting—switching state, the energy storage capacitor is charged.

With respect to DC breakers and DC current limiters containing main and/or auxiliary power semiconductor switches, this known way to supply the gate units of the switching elements appears to be problematic, as under normal operating conditions the DC breaker or DC current limiter is supposed to be conducting for a long period of time, preferably a year or even more, without any need for a switching operation. Accordingly, at least a part of their power semiconductor switching elements is permanently conducting, thereby not offering a blocking state which would allow for the required charging or recharging of the corresponding energy storage capacitors. This makes it difficult to ensure that enough power can be supplied to the gate unit in case the power semiconductor switching elements are to be operated. In addition, the putting of a DC breaker into operation usually means, that the corresponding power transmission or distribution line is afterwards disconnected from the DC grid, thereby leaving the primary circuit at zero voltage. Accordingly, a charging or recharging of the energy storage capacitors of the switching modules of a DC breaker is only possible during the rare and short periods of time when the breaker is opened. If no repeated and regular charging of the energy storage capacitors can be ensured, the reliability of the corresponding DC breaker or DC current limiter is reduced considerably.

A different solution for providing power to the gate units of power semiconductor switches is known from medium voltage converter applications, where a remote power supply via pulse transformers is used, i.e. the power supply works independently of the primary circuit. However, this solution is inapplicable to high voltage levels due to design and cost reasons since the insulation of every pulse transformer needs to withstand at least the nominal DC voltage, which for high voltage applications means several hundred kV. In case of high voltage DC breakers, the overvoltage stress during an opening action requires even an insulation level of almost twice the DC voltage.

It is an object of the present invention to present a solution for a switching module for use in a DC breaker or DC current limiter, in particular for HVDC applications, with which the reliability of the switching module and thereby of the DC breaker or the DC current limiter is increased.

This object is achieved by a switching module which further comprises power transformation means arranged to receive power via an optical power signal, to transform the optical power signal into an electrical power signal and to provide the electrical power signal to the energy storage capacitor.

According to the invention, the power supply of the gate unit is made independent of the voltage conditions in the primary circuit by providing an optical power supply to the energy storage capacitor. Thereby, the charging and recharging of the energy storage capacitor can occur regularly at predetermined intervals of time, so that it can always be ensured that enough power is available for the gate unit to operate the corresponding power semiconductor switching element or elements whenever it is required. The operability and reliability of the DC breaker or DC current limiter containing such a switching module is thereby increased considerably. Since an optical power signal, i.e. light, preferably laser light, transmitted via a fiber optic cable, is used instead for an electrical power signal, the insulation problem of the above described pulse transformer solution is overcome.

In a preferred embodiment of the invention, the optical power signal is a low power signal of less than 1 Watt. Since low power equipment usually features a larger reliability compared to equipment for higher power levels, the use of a low power optical power supply helps to increase the reliability of the switching module further.

If a low power optical power supply is used, certain measures need to be taken to keep the internal power demand of the gate unit at a low level. A preferred way to achieve this is to reduce the number of functions performed by the gate unit to a minimum level.

As was mentioned in the introduction, today's DC breakers or DC current limiters which are applicable to the medium and high voltage levels of DC power distribution and transmission systems, need to contain a considerable number of series connected switching modules. In series-connections, the question of an equal voltage distribution during dynamic and transient processes is important in order to avoid undesired voltage stress on some of the switching modules due to differing switching characteristics of the power semiconductor switching elements of different switching modules.

One of the functions that known gate units perform in high voltage converter valves, where in the valves several power semiconductor switches are connected in series and each power semiconductor switch is equipped with its own gate unit, is to ensure an equal voltage distribution between the series connected switches during dynamic and transient processes This function is according to a preferred embodiment of the invention not performed by the gate unit but instead by an RCD snubber circuit, which is contained in the switching module and is connected in parallel to the at least one power semiconductor switching element. The RCD snubber circuit comprises at least one resistor, at least one capacitor and at least one diode. RCD snubbers are known in the art and are for example disclosed in WO 96/27230. The RCD snubber can be arranged for both unidirectional and bidirectional switching modules (see below), where the unidirectional RCD snubber comprises a series connection of a diode and a capacitor for one current direction, with a resistor in parallel with the diode, and the bidirectional RCD snubber comprises in addition a series connection of a diode and a capacitor for the other current direction, with again a resistor in parallel with the diode.

During turn-off of the power semiconductor switching element, the current through the switching element commutates via the one of the snubber diodes, which corresponds to the current direction, into the at least one snubber capacitor. As is described in the introduction above, a DC breaker typically contains a group of several series connected switching modules which are together connected in parallel with a non-linear resistor working as a surge arrester. A DC current limiter contains several of such groups. When a DC breaker or a DC current limiter is operated, the switching modules of these groups are turned-off simultaneously. Accordingly, the same commutation of the current into the snubber circuit takes place for all of the series connected switching modules per group. As a result, the snubber capacitors of each group are charged until the sum of the snubber capacitor voltages per group is high enough for the arrester of that group to take over the current. When the groups of switching modules are switched on again, the snubber capacitors are discharged via the corresponding snubber resistors. This leads to certain losses which, however, are of no relevance in DC breaker and DC current limiter applications due to the rare occasion of an operating action.

Apart from the equal dynamic voltage distribution, the RCD snubber has some further advantages. Due to the presence of at least one capacitor in the RCD snubber, the rate of rise of the voltage across the corresponding at least one power semiconductor switching element is limited. As a result, individual switching characteristics, like for example individual turn-off delays of the power semiconductor switching elements, which may differ between series connected switching modules, are no longer of concern.

In addition, the limited rate of rise of the voltage shows its advantage in connection with the below described parallel connection of IGBT or BIGT modules, since again different switching delays are no longer of major concern, thereby eliminating the risk of damaging high frequency oscillations between the modules. In general, it can be stated that due to the RCD snubber it becomes possible to connect IGBT or BIGT modules in series and/or in parallel with each other, without at the same time needing to provide for a complex and power demanding gate unit to take care of an even voltage distribution and of possible high frequency oscillations.

A further advantage of the RCD snubber is that, when the power semiconductor element is turned off, the snubber capacitor causes the voltage to start at zero, i.e. the switching is performed at zero voltage. As a result, less instantaneous losses are generated during the turning-off and therefore during the operating of the DC breaker or DC current limiter. The reduced losses allow for higher turn-off currents and/or a larger number of repetitive switching events before a thermal limit of the power semiconductor switching element is reached.

In a further embodiment of the invention, the gate unit is connected to the gate of the power semiconductor switching element via an H-bridge which produces and outputs the bipolar DC voltage required to drive the gate of the at least one power semiconductor switching element, where the H-bridge is supplied by a unipolar DC voltage and outputs a symmetrical bipolar DC voltage, for example ±15V. According to this embodiment, the gate unit can operate internally with a unipolar DC voltage, opposed to the gate unit known from EP 0 868 014 B1 which operates internally with bipolar DC voltages and thereby two internal power supplies. Using the unipolar operating DC voltage reduces the internal power demand of the gate unit even further and makes it even more suitable to be used with a low power supply level. When using two internal power supplies instead of an H-bridge, unsymmetrical DC voltages can be produced by the gate unit, for example +18V and −5V.

In another embodiment of the invention, the switching module further comprises a control signal detector which is arranged to separate from the received electrical power signal an electrical control signal and to provide the electrical control signal to the gate unit. In other words, a control signal which in particular comprises the switching control signal to initiate the gate unit to turn the at least one power semiconductor switching elements on or off is incorporated into the same optical signal which also contains the power signal and it is still contained in the electrical power signal after the signal transformation by the power transformation means. In this way, the need of an additional fiber optic cable is eliminated.

According to a further embodiment of the invention, the gate unit of the switching module is arranged to generate status information on the functionality of at least one of the elements of the switching module, and the switching module comprises further signal transformation means arranged to transform the status information into an optical information signal and to send out the optical information signal to a central control unit. That the status information is sent out optically is due to the fact that the switching modules are in a DC breaker or DC current limiter application arranged at a high voltage level of up to several hundred kV. Using optical communication simplifies the design and increases the reliability of the communication system.

By providing status information to a central control unit, it becomes possible that the central control unit takes care of each connected switching module individually, for example by sending back a control signal to start a specific test routine in case that a suspicious status is reported which requires further investigation. The central control unit may at the same time generate the above mentioned control signal which initiates the turning on and off of the at least one power semiconductor switching device. In DC breaker and DC current limiter applications, the switching of the switching modules can be delayed up to tens of microseconds until a sufficient number of switching modules is ready for switching, since the actual operation of the DC breaker or DC current limiter needs to occur less instantaneously than it is for example required in a converter application. As a result, it can be ensured that the switching modules are turned on or off as simultaneously as possible. In other words, by exchanging status information with the central control unit, it becomes possible to implement a handshake protocol between the central control unit and all the switching modules of the DC breaker or DC current limiter, where the handshake protocol arms and synchronizes the gate units and sends out the actual turning-on or turning-off control signal only when all or—in case of redundancy—enough switching modules are ready.

The at least one power semiconductor switching element of the switching module can be of different type and design, depending on the operational and cost requirements of the DC breaker or DC current limiter where the switching module is to be used in. In the following, some preferred types are briefly described, which are suitable to be used either in a unidirectional or in a bidirectional DC breaker or DC current limiter. In order to be applicable to a bidirectional DC breaker or a DC current limiter, the unidirectional power semiconductor switching elements need to be duplicated and the duplicate needs to be arranged for the opposite current direction, i.e. in anti-parallel or anti-serial direction to the original power semiconductor switching element.

In one unidirectional type of the at least one power semiconductor switching element, the switching element comprises a first module containing one first IGBT or a first parallel connection of several IGBT as well as one first diode or a first parallel connection of several diodes, where the diode or diodes are connected in anti-parallel with the IGBT or parallel connection of IGBT. If one or several parallel-connected IGBT and diodes are used, depends on the current level which is to be achieved with the power semiconductor switching element, i.e. the higher the number of parallel-connected IGBT and diodes the higher the rated current, where all parallel-connected IGBT are controlled via the same gate unit.

A bidirectional power semiconductor switching element can be achieved by connecting a suitable number of above modules in anti-parallel or anti-serial connection, where an anti-parallel connection is possible in case that the IGBT have reverse blocking capability. In other words, the switching module then further comprises at least a second module connected in anti-parallel or anti-serial with the first module, the second module containing one second IGBT or a second parallel connection of several IGBT and one second diode or a second parallel connection of several diodes, where the diode or diodes are again connected in anti-parallel with the IGBT or parallel connection of IGBT.

The first and second modules may in practice be based on different physical packaging concepts of the chips of the IGBT and diodes. Either, each module corresponds to one single package containing an integration of IGBT and corresponding anti-parallel diodes, or, all parallel connected IGBT of the same current direction are integrated in one package and all parallel connected diodes of the same current direction are integrated in another package. The latter design would overcome a problem which may occur in connection with the first design. In the first design, the diodes of different packages may stem from different production cycles, and therefore they may slightly differ in their characteristics, such as the forward voltage drop. Since the diodes have a negative temperature coefficient, different forward voltage drops may lead to an undesired current flow between the diodes which could result in a so called thermal runaway of the diode chips, i.e. in an increase in temperature due to the current flow which increases the current flow even further. When all parallel diodes of the same current direction of the power semiconductor switching element are integrated in the same package, as proposed in the second design, it is ensured that their characteristics match as closely as possible with each other, thereby minimizing the risk of thermal runaway.

In a special embodiment of the above described type of power semiconductor switching element, the diodes are line commutated diodes. Usually, so called fast recovery diodes are used as anti-parallel diodes for IGBT, since they are especially suitable for the fast switching applications that IGBT are usually intended for. However, in the case of DC breakers and DC current limiters, no fast switching actions are required, so that line commutated diodes, such as known from standard 50 Hz rectifier applications, may be used instead. Since line commutated diodes have a lower voltage drop compared to fast recovery diodes, the losses of above described first and second modules may be reduced. In addition, line commutated diodes are less costly.

In an alternative unidirectional type of power semiconductor switching element, the switching element comprises a first module containing one first reverse conducting IGBT or a first parallel connection of several reverse conducting IGBT. In a reverse conducting IGBT, the IGBT and the anti-parallel diode function are directly integrated in one common chip. Reverse conducting IGBT are for example described in the European patent application 09159009.1 and are also called Bi-mode Insulated Gate Transistor (BIGT). As mentioned above, a parallel connection of several such BIGT provides for a higher rated current of the power semiconductor switching element.

A bidirectional power semiconductor switching element can be achieved by connecting two or more BIGT-modules in anti-serial connection. Accordingly, it is suggested that the above power semiconductor switching element further comprises a second module connected in anti-serial connection with the first module, the second module containing one second reverse conducting IGBT or a second parallel connection of several reverse conducting IGBT.

The use of BIGT instead of separate IGBT and anti-parallel diodes implies several advantages.

One advantage is that the forward voltage drop of the integrated diode shows a positive temperature coefficient, so that the problem of a possible thermal runaway is avoided.

In case of a special embodiment of a bidirectional DC breaker based on BIGT, the power semiconductor switching elements would each comprise an anti-serial connection of two BIGT, where the two BIGT are vertically integrated in one and the same package. In a typical bidirectional DC breaker application, the current flows in one and the same direction for a considerably long period of time, which in case of common IGBT with separate diode means that the silicon area of the power semiconductor switching elements of the bidirectional DC breaker is only partially used. Opposed to that, due to the vertical integration, the silicon area of the bidirectional BIGT packages can be fully utilized resulting in either a minor number of chips for the same current rating or in an increase of the current capability for a given number of chips per package.

A third advantage is that the functionality of the diode can easier be monitored in case of a BIGT than in case of separate IGBT and diode.

In general, it is advantageous to provide the switching module with an additional diode monitoring means which is arranged to perform a test of the blocking functionality of the anti-parallel diode or diodes and which thereby can indicate if the corresponding IGBT in the power semiconductor switching element is available for normal operation or not. This is recommended since it may happen on rare occasions that the anti-parallel diode, or diodes, breaks down when the corresponding IGBT is in the turn-off or non-conducting state, which may have serious consequences. In fast switching applications, it is possible to test the blocking functionality of the diodes frequently when the corresponding IGBT is in the non-conducting state and no main current is flowing through the diode. However, in a DC breaker or DC current limiter, where at least part of the IGBT are turned on continuously, this is not in the same way possible for the corresponding diodes. Nevertheless, it is important to get information on defective diodes prior to the opening of a DC breaker or to the putting into operation of a DC current limiter, since such defective diodes could result in a fatal damage.

Therefore, for switching modules containing separate IGBT and diodes it is suggested to provide a diode monitoring means which is adapted to monitor the blocking functionality of the diode or diodes whenever the corresponding IGBT are turned-off and no main current is flowing through the diode or diodes to be monitored. In other words, a test is performed as often as possible, where for some DC breaker configurations this may mean that a test can only be performed during maintenance, while for other configurations, such as the DC breaker described in PCT/EP2009/065233, the test can be performed continuously for those switching modules which are not carrying the primary current. The test includes simply to apply a minor positive test voltage in forward direction of the turned-off IGBT and to check whether this voltage is maintained or whether it decreases and possibly even breaks down due to failure of the diode. If the latter occurs, a failure information can be generated, for example by the gate unit, and sent as an optical information signal to a central control unit. In connection with the above described RCD snubber, a further way of testing the functionality of the anti-parallel diodes becomes possible: in a DC breaker or DC current limiter which contains several switching modules in series connection, this further test is performed when the DC breaker or DC current limiter is turned on and the current flows in forward direction through the series-connected IGBT. For testing the functionality of the diodes, one or several of the series-connected IGBT can now be actively turned off for a very short period of time, preferably a couple of microseconds, until the current flowing through the turned-off IGBT has started to commutate to the corresponding RCD snubber circuit and until the voltage across the RCD snubber has started to rise slightly. As soon as the voltage rise is detected, the one or several IGBT are switched on again, where the voltage rise can be detected in a simple way by checking whether a predefined voltage limit is exceeded, where the voltage limit lies at a comparatively low voltage level of preferably a couple of hundred V up to a few kV only. If no voltage rise can be detected, a failure information is generated. In this way, testing of the diodes in the switching modules becomes possible without interfering with the operation of the DC breaker or DC current limiter.

As becomes clear from the above, it is generally difficult to generate reliable information on the blocking capability of the diodes for the switching module configuration with separate IGBT and diodes. Opposed to that, it is possible to detect failure of the integrated diode function in a BIGT during both the turn-on and the turn-off state of the corresponding IGBT. The possible detection of a failing or failed diode function in a BIGT during practically all of the operating states of the BIGT in DC breaker applications, is due to the fact that a defective integrated diode function can be observed by a clear deterioration or even breakdown of the gate-emitter voltage of the corresponding IGBT. Therefore an increased gate emitter leakage current can be used as an indication or monitor for an irreversible damage of either the diode function or the IGBT of the BIGT. Accordingly, the suggested diode monitoring means for a switching module containing BIGT is adapted to monitor the blocking functionality of the diode function or diode functions of the reverse-conducting IGBT by generating a failure information in case the gate-emitter voltage across the turned-on or turned-off reverse-conducting IGBT breaks down. Due to the possibility to perform the test both in the turn-on and turn-off state of the BIGT, there exist many more chances to derive an information on the blocking capability of the diode function in the BIGT compared to the solution with separate IGBT and diode, thereby increasing the reliability of the DC breaker or DC current limiter considerably.

Apart from the dynamic voltage distribution discussed above in connection with the RCD snubber, it is also advantageous if the steady-state voltage distribution of series connected switching modules is kept as equal as possible in order to avoid increased voltage stress on some of the modules. According to a further embodiment of the invention, it is therefore suggested that a non-linear, voltage-limiting resistor is connected in parallel with the at least one power semiconductor switching element. Such a non-linear, voltage-limiting resistor not only ensures equal steady-state voltage distribution, but in addition limits overvoltages when the arrester of a group of series connected switching modules takes over the current from the snubber circuits of that group. The arrester of a group of series connected switching modules is in the following also called main arrester. Further advantages of the non-linear, voltage limiting resistor in a switching module are that it allows for a reduction in size of the snubber capacitor of that module, that it enables for larger capacitor tolerances between different modules and that it simplifies the mechanical design of the current commutation path for the main arrester.

Figure 2:
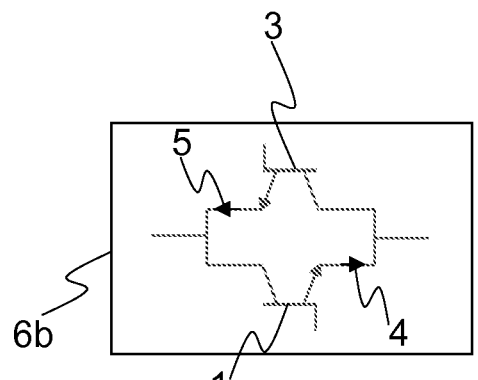
Figure 3:
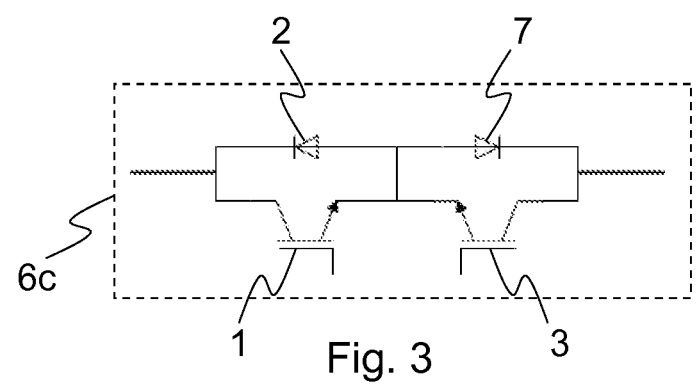
Figure 4:
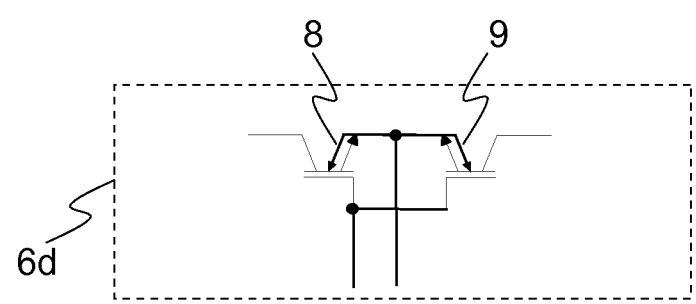
Figure 5:
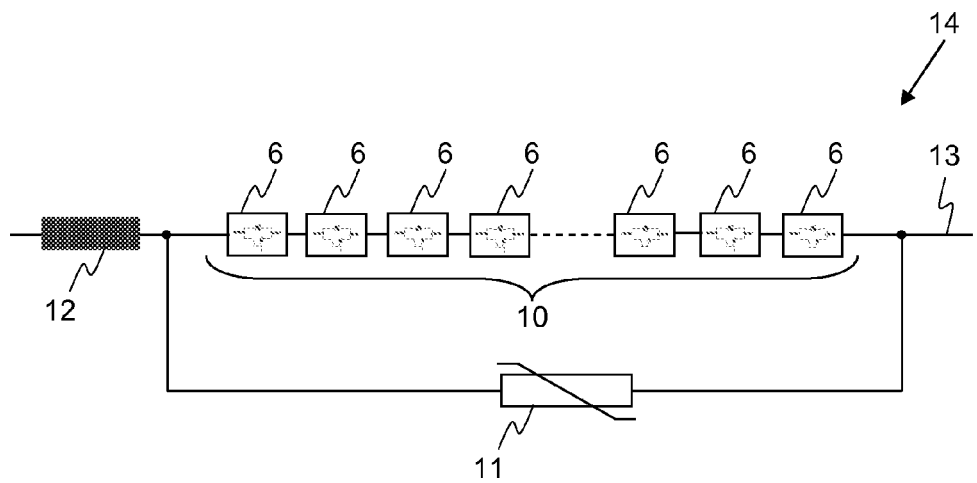
Figure 6:
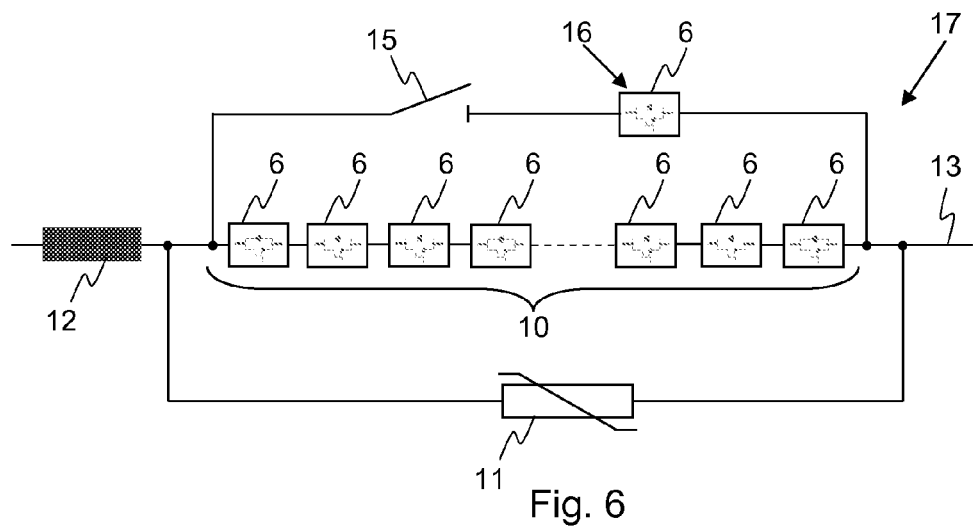
Figure 7:
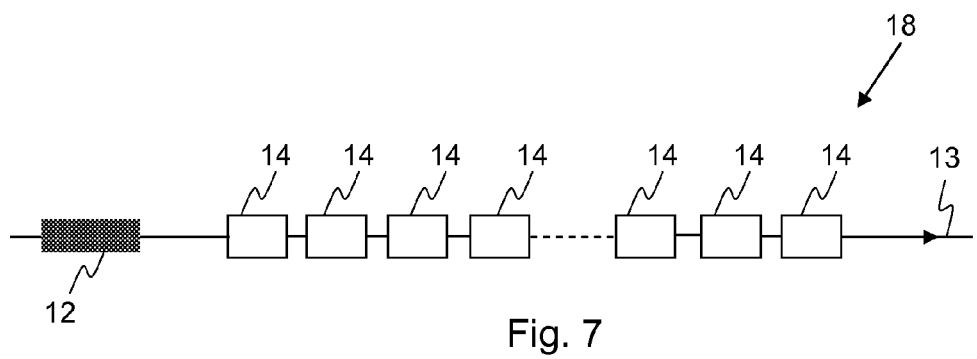
Figure 8:
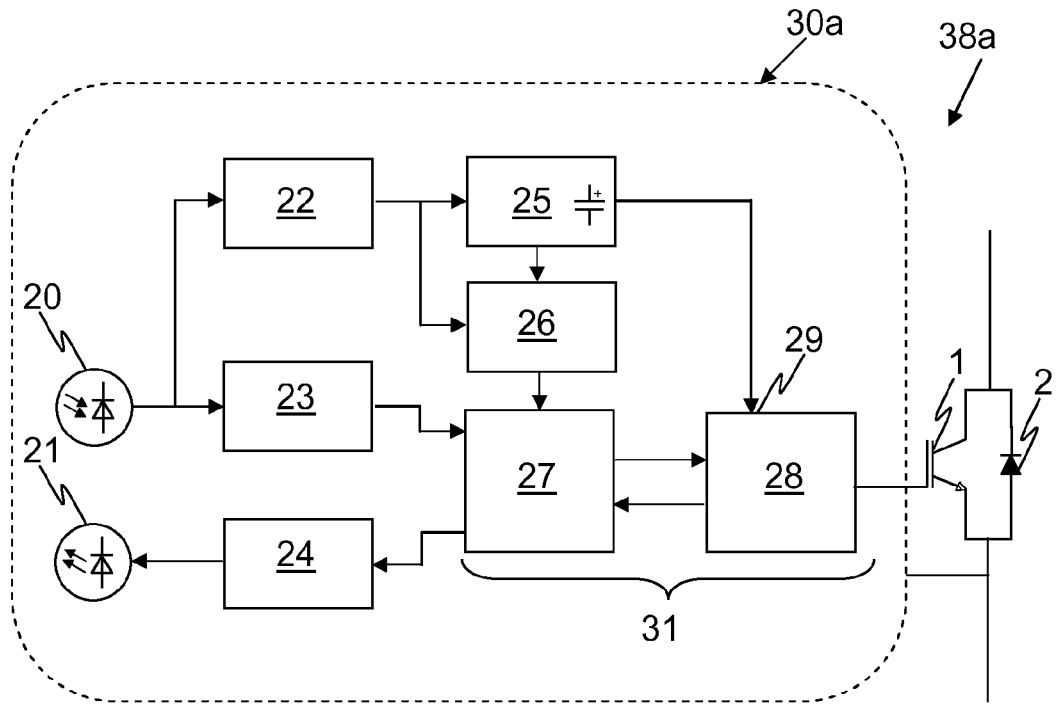
Figure 9:
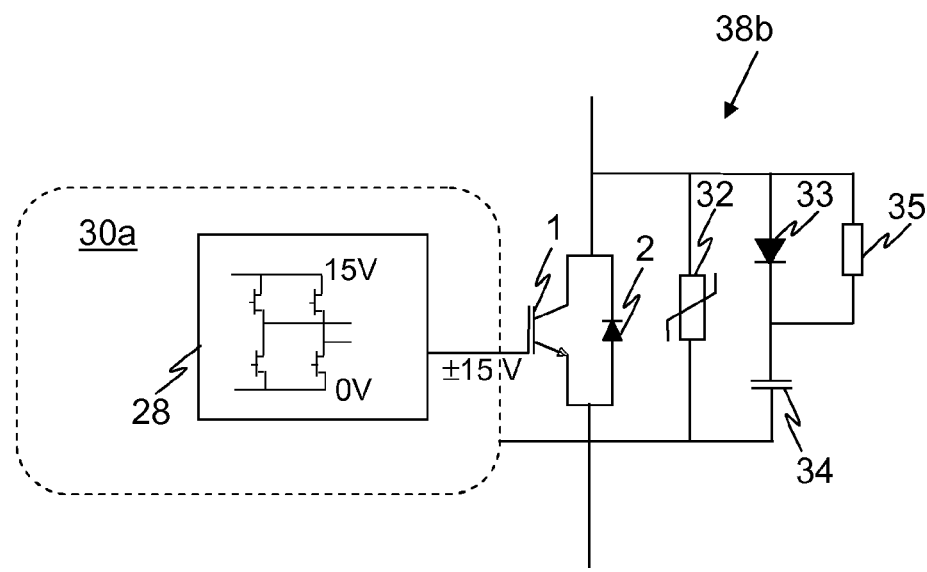
Figure 10:
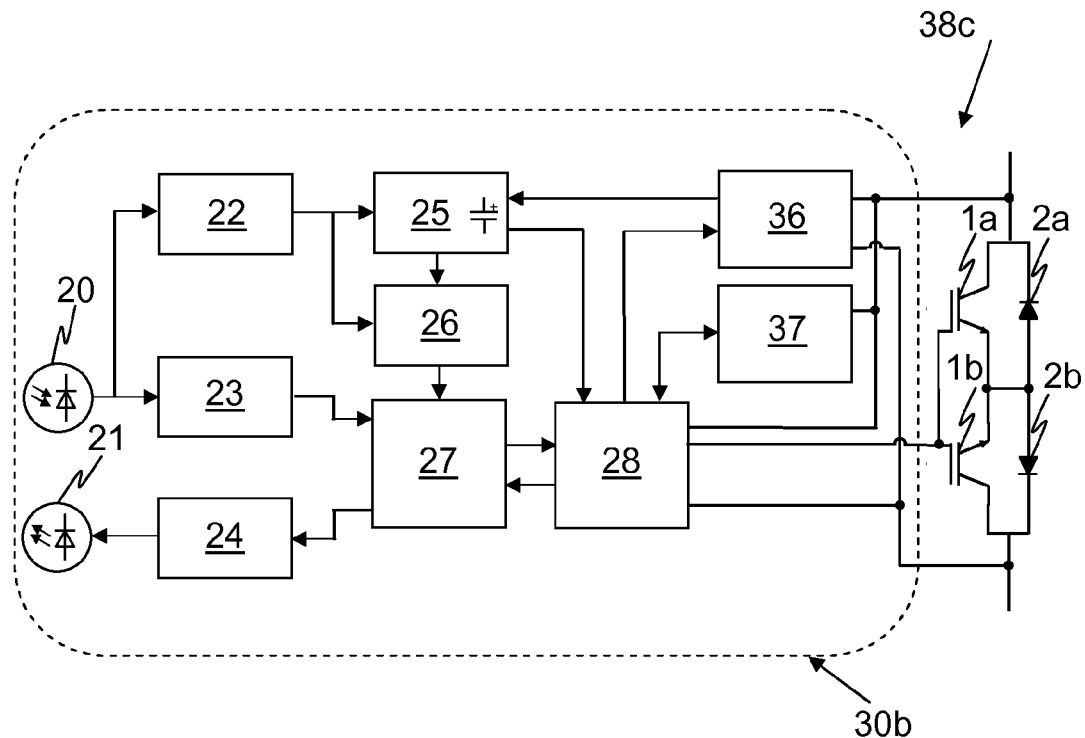
Figure 11:
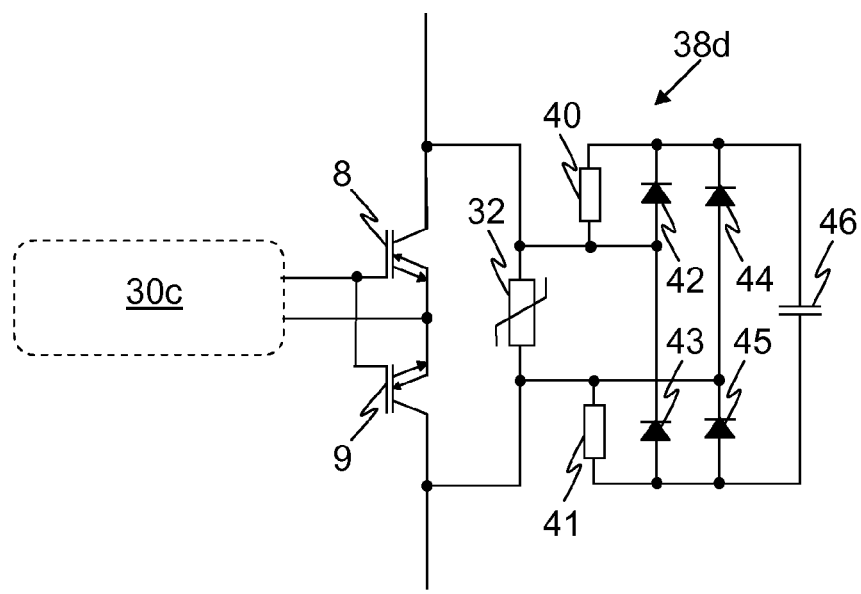
Figure 12:
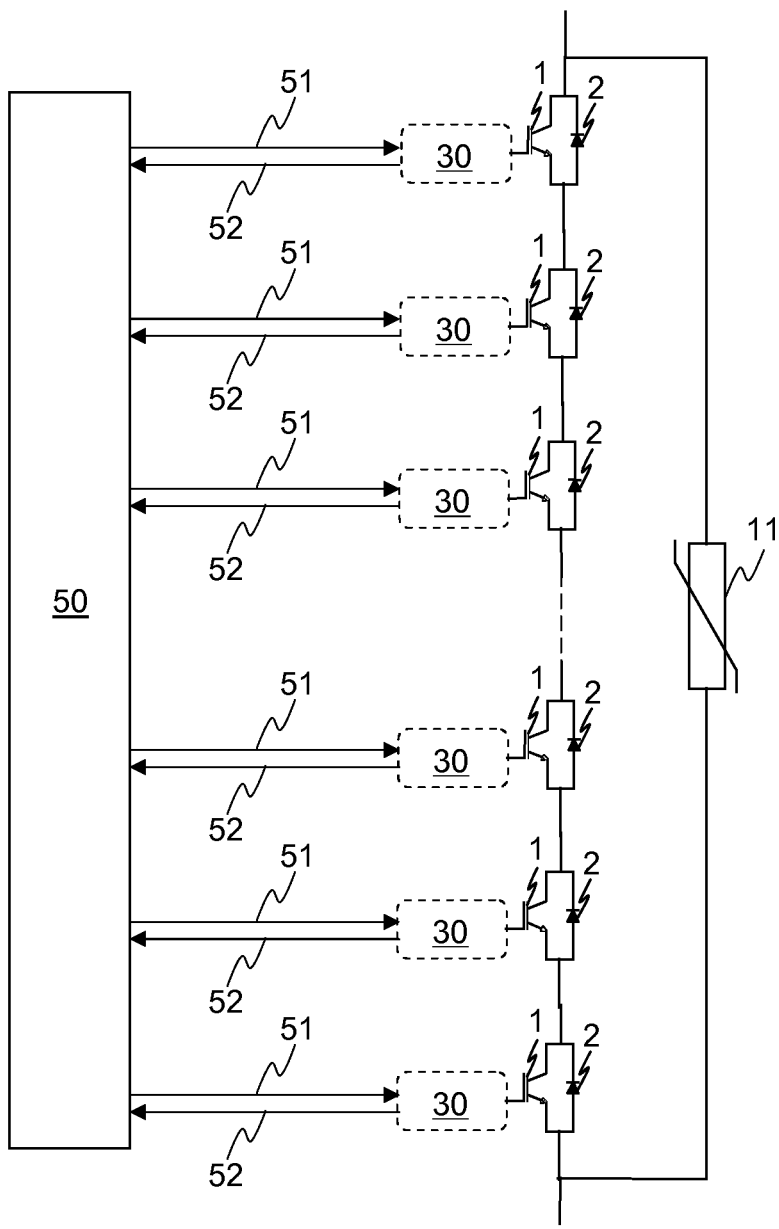
Figure 13:
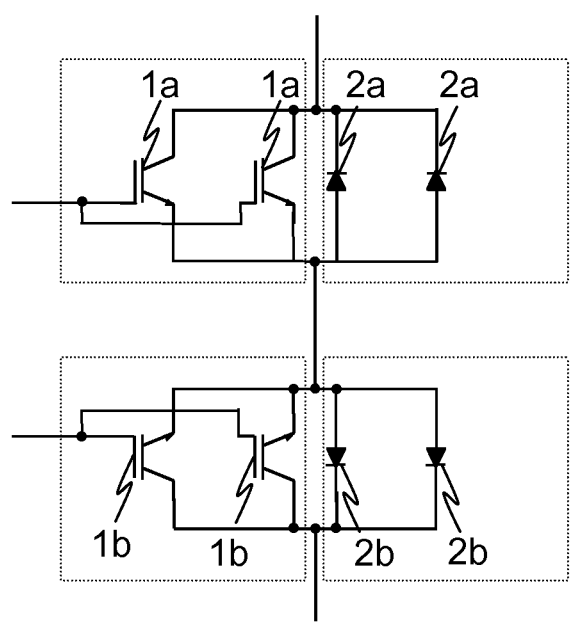

The invention and its embodiment will now be explained with reference to the appended drawings in which:

FIG. 1 shows a first base element containing power semiconductor switching elements arranged for unidirectional applications, FIG. 2 shows a second base element containing power semiconductor switching elements arranged for bidirectional applications, FIG. 3 shows a third base element containing power semiconductor switching elements arranged for bidirectional applications, FIG. 4 shows a fourth base element containing power semiconductor switching elements arranged for bidirectional applications, FIG. 5 shows a first example for a DC breaker, FIG. 6 shows a second example for a DC breaker, FIG. 7 shows an example for a DC current limiter, FIG. 8 shows a first embodiment of a switching module, FIG. 9 shows a second embodiment of a switching module, FIG. 10 shows a third embodiment of a switching module, FIG. 11 shows a fourth embodiment of a switching module, FIG. 12 shows an arrangement of a central control unit and the switching modules of a DC breaker, FIG. 13 shows an arrangement of power semiconductor switching elements of a switching module.

FIG. 1 shows a first base element 6a containing power semiconductor switching elements arranged for unidirectional applications. The power semiconductor switching elements are an IGBT 1 of a first current direction 4 and a free-wheeling diode 2 connected in anti-parallel to the IGBT 1.

In FIG. 2, a second base element 6b can be seen which comprises a parallel connection of the IGBT 1 of the first current direction 4 and of an IGBT 3 of a second, opposite current direction 5. Accordingly, the second base element 6b is suitable for bidirectional applications.

In FIG. 3, a third base element 6c is shown which comprises a series connection of the IGBT 1 of the first current direction and the IGBT 3 of the opposite, second current direction, which is in other words an anti-serial connection of two IGBT. Each IGBT has a free-wheeling diode 2 and 7, respectively, connected in anti-parallel. The base element 6c is suitable for bidirectional applications.

A fourth base element 6d is shown in FIG. 4. It comprises as power semiconductor switching elements a reverse-conducting IGBT of the first current direction, which is also called a BIGT 8 (Bi-mode Insulated Gate Transistor), and in series with the BIGT 8 a reverse-conducting IGBT of the second current direction, called BIGT 9. The BIGT 8 and 9 are accordingly connected in an anti-serial manner, meaning that also the fourth base element 6d is suitable for bidirectional applications.

The base elements 6a-6d may be used in a DC breaker 14 according to the example depicted in FIG. 5. The DC breaker 14 is suitable for medium or high voltage applications, and it is connected in series with a DC power distribution or transmission line 13. In case that the primary current in line 13 needs to be interrupted in one direction only, base elements 6a may be used, while in case that the primary current in line 13 needs to be interrupted in both possible directions, base elements 6b or 6c or 6d are to be used. The DC breaker 14 comprises a main breaker 10 containing a series-connection of several tens up to several hundreds of base elements 6, —depending on the voltage level—, as well as a non-linear resistor, which is also called main arrester 11 and which is connected in parallel with the main breaker 10. In series with the DC breaker 14, a reactor 12 is arranged for limiting the current rate in the line 13. Under normal operating conditions of line 13, all IGBT or BIGT in the base elements 6 are turned-on, i.e. DC breaker 14 is conducting the primary current of line 13. In case that the primary current is to be interrupted, for example if a fault has occurred in line 13, all IGBT or BIGT are to be turned-off simultaneously, in order for the primary current to commutate to the main arrester 11 which will then reduce the current to zero.

Another example for a DC breaker 17, for which base elements 6a-6d may be used, is shown in FIG. 6. In addition to the main breaker 10 and the main arrester 11, there is provided a series-connection of a high speed switch 15 and an auxiliary breaker 16 connected in parallel to the main breaker 10 and the main arrester 11. The auxiliary breaker 16 contains just one base element 6. The high speed switch 15 is a mechanical switch. In series with the DC breaker 17, again a reactor 12 is placed for current rate limitation.

It is interesting to note that in case that the base elements 6 used in the DC breaker configurations of FIGS. 5 and 6 are bidirectional base elements of either type 6b, 6c or 6d, the same configurations are also suitable to be used as AC breakers for AC power distribution or transmission lines.

In FIG. 7, an example for a DC current limiter 18 is shown, where the DC current limiter 18 comprises a series connection of multiple DC breakers 14. In other words, the DC current limiter 18 contains multiple groups of series connected base elements 6, where each group comprises in parallel with the base elements 6 a main arrester 11. The DC current limiter 18 is connected in series with a current rate limiting reactor 12 and with a DC power distribution or transmission line 13. In case that the primary current in line 13 is to be limited or reduced, a suitable number of DC breakers 14 is opened, so that the corresponding non-linear resistors may dissipate the undesired amount of electrical energy. In its most reduced form, a DC current limiter should contain two breakers 14, in the following called a first and a second breaker. The protective level of the main arrester of the first breaker corresponds to the nominal DC voltage level of line 13. When the current through line 13 is to be limited or reduced, the first breaker would be opened. The protective level of the main arrester of the second breaker can be set to a value below the nominal DC voltage level of line 13, for example 50% of it. After the first breaker is opened, the second breaker can be used to interrupt the current in line 13 by opening the second breaker as well.

The invention is now further explained with respect to FIGS. 8 to 12. In order for the base elements 6 in a DC breaker or a DC current limiter to be operated, so called gate units are required which cause the corresponding IGBT or BIGT to be turned on or off, according to a control signal generated by a central control unit in dependence on the status of line 13. Accordingly, the base elements 6 of DC breakers 14 or 17 or of DC current limiter 18 actually contain more than just the power semiconductor switching elements. In fact, each base element 6 can be replaced by a switching module 38, where the switching module 38 comprises amongst others a gate unit 31. Different embodiments of the switching module 38 will now be described, where for each embodiment the power semiconductor switching elements actually shown can be replaced by the power semiconductor switching elements belonging to another suitable one of the base elements 6a-6d and also by further combinations of them as explained below.

A first embodiment 38a of the switching module is depicted in FIG. 8, and it comprises besides an IGBT 1 and an anti-parallel diode 2 a first embodiment 30a of a gate driving module connected to the gate of the IGBT 1. The gate driving module 30a comprises power transformation means in form of a photodiode 20, a DC/DC converter 22, an energy storage capacitor 25 and a gate unit 31. The photodiode 20 is arranged to receive an optical power signal, to transform the optical power signal into an electrical power signal and to provide the electrical power signal via the DC/DC converter 22 to the energy storage capacitor 25, thereby charging or recharging the energy storage capacitor 25 from a power source which is independent of the status or switching condition of the circuit, also called primary circuit, where the IGBT 1 and diode 2 are a part of. The optical power signal is hereby a low power signal of less than 1 Watt.

The energy storage capacitor 25 is connected to a power supply input 29 of the gate unit 31 in order to supply a gate driver and supervision module 28 with the required energy to drive the gate of IGBT 1. The gate unit contains apart from the gate driver and supervision module 28 a gate unit control module 27. The gate unit control module 27 receives an electrical control signal from a control signal detector 23, where the control signal detector 23 is arranged to separate the electrical control signal from the electrical power signal which is output by the photodiode 20. Accordingly, the optical power signal received by the photodiode 20 also contains an optical information signal which after the transformation into an electrical signal is still present. The photodiode 20 is connected via a first fiber optic cable 51 to a central control unit 50 (see FIG. 12).

The gate unit control module 27 processes the electrical control signal and outputs a resulting turn-on or turn-off order signal to the gate driver and supervision module 28, which accordingly causes the IGBT 1 to turn on or turn off. The gate unit control module 27 further receives different information, such as information delivered by the gate driver and supervision module 28 on the status of the IGBT 1 and information delivered by a power supervision unit 26 on the status of the elements involved in the power supply of the gate driver and supervision module 28, i.e. information on the status of the energy storage capacitor 25 and of the DC/DC converter 22. The different information are processed by the gate unit control module 27 and then provided as status information via a signal transmitting module 24 to a signal transformation means, which in this example is a light emitting diode 21. The light emitting diode 21 is connected via a second fiber optic cable 52 to the central control unit 50 (see FIG. 12), which in reaction to the received status information may adapt the control signal sent via the optical power signal to the photodiode 20.

A second embodiment 38b of the switching module is shown in FIG. 9, where the second embodiment 38b contains the same gate driving module 30a as the first embodiment 38a. One detail of the gate driver and supervision module 28 is shown here which is not shown in FIG. 8. From FIG. 9, it can be seen that the gate driver and supervision module 28 and thereby the gate unit 31 is connected via an H-bridge to the gate of the at least one power semiconductor switching element, which here is an IGBT 1 with an anti-parallel diode 2, where the H-bridge is supplied by a unipolar DC voltage of 15 V and outputs a bipolar DC voltage of ±15 V. Accordingly, the internal power demand of the gate unit 31 is reduced to some extent.

In addition to the first embodiment 38a, the second embodiment 38b of the switching module contains a non-linear, voltage-limiting resistor 32 in parallel with the at least one power semiconductor switching elements as well as an RCD snubber circuit consisting of a series connection of a diode 33 and a capacitor 34 as well as a resistor 35 in parallel with the diode 33, where the RCD snubber circuit itself is also connected in parallel with the at least one power semiconductor switching element. The orientation of the diode 33 is the same as the orientation of the IGBT 1. The RCD snubber circuit is mainly responsible for an equal dynamic voltage distribution in a series connection of several switching modules 38, as would for example be applicable to the DC breakers 14 and 17 or the DC current limiter 18, when the base elements 6 are replaced with switching modules 38. The non-linear, voltage-limiting resistor 32 mainly ensures an equal steady-state voltage distribution in such a series connection of switching modules 38.

In the third embodiment 38c of the switching module according to FIG. 10, in addition to the one IGBT 1 and the one diode 2 of the first and second embodiments, 38a and 38b, respectively, which together form a first module referenced by the letter a, a second module, referenced by the letter b, containing a second IGBT 1 and a second anti-parallel diode 2 is connected in anti-serial connection with the first module. Accordingly, the switching module 38c can be applied to a bidirectional DC breaker or a bidirectional DC current limiter.

As already described, further and alternative combinations of IGBT and diodes are possible. An example is shown in FIG. 13, where both the first and the second module each comprise not only one but two parallel connected IGBT 1a or 1b and corresponding anti-parallel diodes 2a or 2b, respectively. The physical packaging of the two modules can either be in the form of one package for each pair of IGBT and corresponding diode, or in the form of a first package with all the IGBT 1a of the first current direction, a second package with all the IGBT 1b of the other second current direction, and a third and fourth package with all the diodes 2a and 2b, respectively, also according to their current direction. This latter type of packaging, which provides a considerable reduction of the risk of thermal runaway, as was described above, is depicted in FIG. 13 by the dotted lines.

The third embodiment 38c of the switching module comprises apart from the first and second modules of IGBT and diodes a second embodiment 30b of the gate driving module, where this second embodiment 30b comprises two further units not contained in the first embodiment 30a. One of the further units is a diode monitoring means 37, the task of which is to monitor the blocking functionality of the diodes 2 in the first module. The monitoring is done by applying a positive test voltage in forward direction to the IGBT 1a or 1b, respectively, whenever they are turned-off and when no main current is flowing through the corresponding diodes. By checking whether this test voltage is maintained or not, a failing or failed diode 2a or 2b, respectively, can be recognized. Taking the example of the DC breaker 17, the diode monitoring can be performed for the diodes in the main breaker 10 during normal operation, since the main or primary current flows during that time through the auxiliary breaker 16 and the high speed switch 15.

The other further unit of the second embodiment 30b of the gate driving unit is an auxiliary recharge circuit 36 which in addition to the optical power supply provides energy to the energy storage capacitor 25 whenever possible and which takes its energy from the primary circuit where the IGBT 1 and the diodes 2 are connected to. However, as is described above, the occasions for recharging from the primary circuit, i.e. the occasions when the IGBT 1 are turned off in a DC breaker or DC current limiter application are usually quite rare. Both the monitoring and the auxiliary recharging are initiated by a corresponding start signal sent from the gate driver and supervision module 28 to the diode monitoring means 37 and to the auxiliary recharge circuit 36, respectively. These start signals can either be generated internally in the switching module, by the gate unit control module 27 or by the auxiliary recharge circuit 36 itself in case it is intelligent enough to adapt to the conditions in the primary circuit, or they can be sent in the form of a corresponding control signal via the first fiber optic cable 51 from the central control unit 50 (see FIG. 12) to the switching module and then transmitted via the control signal detector 23, the gate unit control module 27 and the gate driver and supervision module 28 to the diode monitoring means 37 and the auxiliary recharge circuit 36, respectively.

A fourth embodiment 38d of the switching module is depicted in FIG. 11. Here, the at least one power semiconductor switching element is an anti-serial connection of two reverse conducting IGBT according to the fourth base element 6d, or in other words a series connection of a BIGT 8 of a first current direction and of a BIGT 9 of a second current direction. As a result, the switching module is suitable for bidirectional applications. In parallel with the anti-serial BIGT 8 and 9, again a non-linear, voltage-limiting resistor 32 is arranged and in parallel with this resistor 32, a bidirectional RCD snubber circuit is connected. The bidirectional RCD snubber circuit contains a first parallel connection of a first diode 42 and a first resistor 40, where the first diode 42 is of the first current direction, a second parallel connection of a second diode 45 and a second resistor 41, where the second diode 45 is of the second current direction, a common capacitor 46 connected in series with and between the first and the second parallel connection, a third diode 44 connected between and having the direction from the cathode of the second diode 45 to the cathode of the first diode 42 and a fourth diode 43 connected between and having the direction from the anode of the second diode 45 to anode of the first diode 42. The gate driving module of the fourth embodiment 38d of the switching module is of a third embodiment 30c, containing basically the same elements as the second embodiment 30b, but where the function of the diode monitoring means differ from the diode monitoring means 37 of FIG. 10 in that the blocking functionality of the integrated diode functions of the BIGT 8 and 9 is monitored together with monitoring the functionality of the IGBT of the BIGT 8 and 9, respectively. The monitoring is performed during both the turn-on and the turn-off state of the IGBT of the respective BIGT, independently of the main or primary current. If the gate-emitter voltage across the turned-on or turned-off reverse-conducting IGBT deteriorates or breaks down, which is detected by detecting an increased gate emitter leakage current, a failure information is generated.

The arrangement of a central control unit 50 and several switching modules of a DC breaker, where the switching modules consist of a gate driving unit 30, an IGBT 1 and an anti-parallel diode 2, has already been referred to earlier. The DC breaker further comprises a main arrester 11. The switching modules of the DC breaker can actually be of any of the four types, 38a-38d, as described above, or of any other combination of the possible embodiments of the main elements of a switching module, where the main elements are the at least one power semiconductor switching element, the gate driving unit, the optional RCD snubber circuit and the optional non-linear, voltage-limiting resistor. As can be seen in FIG. 12, between the central control unit 50 and each gate driving unit 30, two fiber optic cables 51 and 52 are arranged, where the first fiber optic cable 51 is used to transmit an optical power signal from the central control unit 50 to the respective gate driving unit 30 and where the optical power signal in addition contains one or several control signals. The second fiber optic cable 52 is used for the transmission of status information in the form of an optical information signal from the gate driving unit 30 to the central control unit 50.

The invention claimed is:

1. A device to limit and/or break an electrical current flowing through a power transmission or distribution line, the device comprising at least one switching module comprising:
   at least one power semiconductor switching element;
   a gate unit arranged to turn the at least one power semiconductor switching element on and off, respectively, according to a switching control signal;
   an energy storage capacitor arranged to provide power to a power supply input of the gate unit;
   a power transformation device arranged to receive an optical power signal that includes an optical information signal, to transform the optical power signal into an electrical power signal that includes an electrical control signal and to provide the electrical power signal to the energy storage capacitor; and
   a control signal detector connected to the power transformation device and arranged to receive the electrical power signal from the power transformation device, detect the electrical control signal from the electrical power signal, and provide the electrical control signal to the gate unit,
   wherein the electrical control signal comprises said switching control signal.

2. The device according to claim 1, wherein the optical power signal is a low power signal of less than 1 Watt.

3. The device according to claim 1, further comprising as the at least one power semiconductor switching element a first module containing one first IGBT or a first parallel connection of several IGBT and one first diode or a first parallel connection of several diodes, where the diode or diodes are connected in anti-parallel with the IGBT or parallel connection of IGBT.

4. The device according to claim 3, wherein the switching module further comprises a second module connected in anti-parallel or in anti-serial connection with the first module, the second module containing one second IGBT or a second parallel connection of several IGBT and one second diode or a second parallel connection of several diodes, where the diode or diodes are connected in anti-parallel with the IGBT or with the parallel connection of IGBT.

5. The device according to claim 3, wherein the diodes are line commutated diodes.

6. The device according to claim 1, further comprising as the at least one power semiconductor switching element a first module containing one first reverse conducting IGBT or a first parallel connection of several reverse conducting IGBT.

7. The device according to claim 6, further comprising a second module connected in anti-serial connection with the first module, the second module containing one second reverse conducting IGBT or a second parallel connection of several reverse conducting IGBT.

8. The device according to claim 7, wherein the first and second modules are integrated in one single semiconductor package, and where the package is provided with one common gate terminal and with one common emitter terminal, the terminals being connected to the gates and emitters, respectively, of all reverse conducting IGBT in the package.

9. The device according to claim 6, further comprising a diode monitoring device adapted to monitor the blocking functionality of the diodes or diode function, respectively, in the first and/or second modules, and where the diode monitoring device is adapted to monitor the blocking functionality of the diode function or diode functions of the reverse-conducting IGBT together with the monitoring of the functionality of the corresponding IGBT itself by generating a failure information in case the gate-emitter voltage across the turned-on or turned-off reverse-conducting IGBT deteriorates or breaks down.

10. The device according to claim 9, wherein the deterioration or break-down of the gate-emitter voltage is detected by detecting an increased gate emitter leakage current of the reverse-conducting IGBT.

11. The device according to claim 1, wherein the switching module further comprises a non-linear, voltage-limiting resistor in parallel with the at least one power semiconductor switching element.

12. The device according to claim 1, further comprising an RCD snubber circuit connected in parallel to the at least one power semiconductor switching element, where the RCD snubber circuit comprises at least a resistor, at least a capacitor and at least a diode, with the diode and the capacitor being connected in series with each other and the resistor being connected in parallel with the diode.

13. The device according to claim 1, wherein the gate unit is connected to the gate of the at least one power semiconductor switching element via an H-bridge, where the H-bridge is supplied by a unipolar DC voltage and which outputs a bipolar DC voltage.

14. The device according to claim 1, further comprising a diode monitoring device adapted to monitor blocking functionality of diodes or diode function, respectively, in a first module and/or a second module of the at least one switching module.

15. A device to limit and/or break an electrical current flowing through a power transmission or distribution line, the device comprising at least one switching module comprising:
   at least one power semiconductor switching element and at least one diode or diode function, where a diode or diode function is in antiparallel with a power semiconductor switching element;
   a gate unit arranged to turn the at least one power semiconductor switching element on and off, respectively, according to a switching control signal;
   an energy storage capacitor arranged to provide power to a power supply input of the gate unit;
   a power transformation device arranged to receive an optical power signal, to transform the optical power signal into an electrical power signal and to provide the electrical power signal to the energy storage capacitor; and
   a diode monitoring device adapted to monitor the blocking functionality of said diode(s) or diode function(s) whenever the corresponding power semiconductor switching element(s) are turned-off and no main current is flowing through the diode(s) or diode function(s) to be monitored, where during the monitoring a positive test voltage is applied to the forward direction of the switching element(s) and a failure information is generated in case the test voltage is not maintained.

16. The device according to claim 15, wherein the switching module is further arranged to separate from the optical power signal an electrical control signal and to provide the electrical control signal to the gate unit.

17. The device according to claim 15, wherein the optical power signal is a low power signal of less than 1 Watt.

18. The device according to claim 15, wherein the gate unit is arranged to generate status information on the functionality of at least one of the elements of the switching module and where the switching module further comprises signal transformation means arranged to transform the status information into an optical information signal and to send out the optical information signal to a central control unit.

19. A device to limit and/or break an electrical current flowing through a power transmission or distribution line, the device comprising at least one switching module comprising:
   at least one power semiconductor switching element;
   a gate unit arranged to turn the at least one power semiconductor switching element on and off, respectively, according to a switching control signal;
   an energy storage capacitor arranged to provide power to a power supply input of the gate unit; and
   a power transformation device arranged to receive an optical power signal, to transform the optical power signal into an electrical power signal and to provide the electrical power signal to the energy storage capacitor,
   wherein the switching module is arranged to provide an electrical control signal to the gate unit, wherein the electrical control signal comprises said switching control signal, and
   wherein the gate unit is arranged to generate status information on the functionality of at least one of the elements of the switching module and where the switching module further comprises a signal transformation device arranged to transform the status information into an optical information signal and to send out the optical information signal to a central control unit.

20. A device to limit and/or break an electrical current flowing through a power transmission or distribution line, the device comprising at least one switching module comprising:
   at least one power semiconductor switching element;
   a gate unit arranged to turn the at least one power semiconductor switching element on and off, respectively, according to a switching control signal;
   an energy storage capacitor arranged to provide power to a power supply input of the gate unit; and
   a power transformation device arranged to receive an optical power signal, to transform the optical power signal into an electrical power signal and to provide the electrical power signal to the energy storage capacitor,
   wherein the switching module is arranged to provide an electrical control signal to the gate unit, wherein the electrical control signal comprises said switching control signal, and
   wherein the switching module further comprises an auxiliary recharge circuit adapted to receive electrical energy from the primary circuit where the at least one power semiconductor switching element is connected to and to provide the electrical energy to the energy storage capacitor.

* * * * *